United States Patent
Liao et al.

(10) Patent No.: US 11,898,245 B2
(45) Date of Patent: Feb. 13, 2024

(54) HIGH THROUGHPUT AND METAL CONTAMINATION CONTROL OVEN FOR CHAMBER COMPONENT CLEANING PROCESS

(71) Applicant: Applied Materials, Inc., Santa Clara, CA (US)

(72) Inventors: Chien-Min Liao, San Jose, CA (US); Chi-Feng Liu, Chubei (TW); Yi Nung Wu, Hsinchu (TW); Hsiu Yang, Santa Clara, CA (US); Yixing Lin, Saratoga, CA (US); Boon Sen Chan, Singapore (SG); Siamak Salimian, Los Altos, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 157 days.

(21) Appl. No.: 17/187,218

(22) Filed: Feb. 26, 2021

(65) Prior Publication Data
US 2022/0275505 A1    Sep. 1, 2022

(51) Int. Cl.
C23C 16/44    (2006.01)
C23C 16/455   (2006.01)
H05B 1/02     (2006.01)

(52) U.S. Cl.
CPC ...... C23C 16/4405 (2013.01); C23C 16/4412 (2013.01); C23C 16/45565 (2013.01); H05B 1/0233 (2013.01)

(58) Field of Classification Search
None
See application file for complete search history.

(56) References Cited

U.S. PATENT DOCUMENTS 5,679,165 A * 10/1997 Maeda ............... C23C 16/54
                                                118/724
5,781,693 A *  7/1998 Ballance ............ C30B 25/14
                                                118/724

(Continued)

FOREIGN PATENT DOCUMENTS

KR    10-1998-0075012    11/1998
KR    10-2005-0024816 A   3/2005

(Continued)

OTHER PUBLICATIONS

PCT International Search Report and Written Opinion for PCT/US2022/017939 dated Jun. 8, 2022.

*Primary Examiner* — Thor S Campbell
(74) *Attorney, Agent, or Firm* — MOSER TABOADA

(57) ABSTRACT

Methods and apparatus for a baking chamber for processing a chamber component are provided herein. In some embodiments, a baking chamber includes: an enclosure defining a first chamber, wherein the first chamber comprises: a first chamber body having a first floor and first sidewalls that couple the first floor to a first lid of the first chamber body to define a first interior volume; a first support disposed in the first interior volume; a first gas line disposed in the first interior volume proximate the first lid; a first showerhead disposed between the first gas line and the first support; a first exhaust coupled to the first floor; and a first heater disposed in the first interior volume between the first support and the first floor; and wherein the enclosure includes a door configured to facilitate transferring the chamber component into and out of the enclosure.

15 Claims, 5 Drawing Sheets

(56) References Cited

U.S. PATENT DOCUMENTS

| | | | | |
|---|---|---|---|---|
| 5,997,651 | A * | 12/1999 | Matsuse | C23C 16/481 |
| | | | | 118/728 |
| 6,090,210 | A * | 7/2000 | Ballance | H01L 21/67115 |
| | | | | 239/596 |
| 6,262,397 | B1 * | 7/2001 | Yazawa | H01L 21/67115 |
| | | | | 118/724 |
| 6,301,434 | B1 * | 10/2001 | McDiarmid | C23C 16/488 |
| | | | | 219/390 |
| 6,331,212 | B1 * | 12/2001 | Mezey, Sr. | H01L 21/67109 |
| | | | | 392/407 |
| 6,448,536 | B2 * | 9/2002 | Li | H01L 21/67103 |
| | | | | 118/724 |
| 6,448,537 | B1 * | 9/2002 | Nering | H01L 21/67109 |
| | | | | 118/724 |
| 6,844,527 | B2 * | 1/2005 | Nguyen | C23C 16/481 |
| | | | | 118/724 |
| 7,029,505 | B2 * | 4/2006 | Sha | H01L 21/67115 |
| | | | | 432/103 |
| 7,762,250 | B2 * | 7/2010 | Elkasevic | F24C 15/006 |
| | | | | 219/394 |
| 8,460,470 | B2 * | 6/2013 | Hirata | C30B 25/10 |
| | | | | 118/725 |
| 8,517,006 | B2 * | 8/2013 | Frock | F24C 15/327 |
| | | | | 248/673 |
| 8,528,889 | B2 * | 9/2013 | Nakano | H01L 21/68707 |
| | | | | 269/903 |
| 8,573,152 | B2 * | 11/2013 | dela Llera | H01R 13/20 |
| | | | | 156/345.46 |
| 8,980,379 | B2 | 3/2015 | Hanawa et al. | |
| 10,043,674 | B1 | 8/2018 | Korolik et al. | |
| 2002/0195437 | A1 * | 12/2002 | Kusuda | H01L 21/67115 |
| | | | | 219/390 |
| 2005/0258162 | A1 * | 11/2005 | Kusuda | F27B 17/0025 |
| | | | | 118/724 |
| 2013/0001215 | A1 * | 1/2013 | Chang | H01J 37/32715 |
| | | | | 219/385 |
| 2014/0099085 | A1 * | 4/2014 | Hayashi | F27D 11/12 |
| | | | | 392/416 |
| 2014/0209245 | A1 * | 7/2014 | Yamamoto | H01J 37/32091 |
| | | | | 361/234 |
| 2014/0273487 | A1 * | 9/2014 | Deshmukh | H01L 21/6875 |
| | | | | 156/345.43 |
| 2014/0273489 | A1 * | 9/2014 | Wang | H01L 21/6708 |
| | | | | 438/716 |
| 2017/0283947 | A1 * | 10/2017 | Rasheed | C23C 16/509 |
| 2017/0338134 | A1 * | 11/2017 | Tan | H01L 21/3065 |
| 2020/0176224 | A1 * | 6/2020 | Ju | H01J 37/32449 |
| 2022/0275505 | A1 * | 9/2022 | Liao | C23C 16/4405 |

FOREIGN PATENT DOCUMENTS

| | | |
|---|---|---|
| KR | 20-0379906 Y1 | 3/2005 |
| KR | 10-2007-0109535 A | 11/2007 |
| KR | 10-2010-0077887 A | 7/2010 |
| KR | 10-1223267 B1 | 1/2013 |
| KR | 2019-0068121 A | 6/2019 |
| KR | 10-2021-0020355 A | 2/2021 |

* cited by examiner

_US 11,898,245 B2_

HIGH THROUGHPUT AND METAL CONTAMINATION CONTROL OVEN FOR CHAMBER COMPONENT CLEANING PROCESS

FIELD

Embodiments of the present disclosure generally relate to semiconductor processing equipment.

BACKGROUND

Susceptors are used in process chambers to support one or more substrates. The process chambers may be, for example, deposition chambers such as physical vapor deposition (PVD) chambers, chemical vapor deposition (CVD) chambers, atomic layer deposition (ALD) chambers, or the like. During use, susceptors collect film deposits and may be periodically cleaned to remove the film deposits. Once the susceptors are cleaned, they are typically placed in an oven, or baking chamber, to remove moisture. However, the inventors have observed that materials of the oven or heating elements of the oven may contaminate the susceptor when heated to high temperatures (e.g., >400 degrees Celsius). Moreover, conventional ovens for baking susceptors typically flow air from one side of the oven to another side to remove or reduce moisture after a cleaning process. The inventors have further observed that such flow arrangements may result in metal contamination on the susceptors when the susceptors are heated to the high temperatures.

Accordingly, the inventors have provided improved baking chambers for processing susceptors and methods of baking susceptors.

SUMMARY

Embodiments of a baking chamber for processing a susceptor and the use thereof are provided herein. In some embodiments, a baking chamber for processing a chamber component includes: an enclosure defining a first chamber, wherein the first chamber comprises: a first chamber body having a first floor and first sidewalls that couple the first floor to a first lid of the first chamber body to define a first interior volume; a first support disposed in the first interior volume for supporting a chamber component; a first gas line disposed in the first interior volume proximate the first lid and configured to supply one or more process gases into the first interior volume; a first showerhead disposed between the first gas line and the first support, wherein the first showerhead includes a plurality of holes configured to direct the one or more process gases from the first gas line to a region between the first showerhead and the first support; a first exhaust coupled to the first floor, wherein the first showerhead and the first exhaust are configured to provide a gas curtain that flows from the first showerhead to the chamber component, around the chamber component, and into the first exhaust during use; and a first heater disposed in the first interior volume between the first support and the first floor; and wherein the enclosure includes a door configured to facilitate transferring the chamber component into and out of the enclosure.

In some embodiments, a baking chamber for processing a susceptor includes: an enclosure defining an upper chamber and a lower chamber, wherein the upper chamber and the lower chamber are fluidly independent and each comprise: a chamber body having a floor and sidewalls that couple the floor to a lid of the chamber body to define an interior volume; a support disposed in the interior volume having a shaft coupled to a pedestal for supporting a susceptor configured to hold one or more substrates; a diffuser disposed in the interior volume proximate the lid and configured to supply one or more process gases into the interior volume via a gas line; a showerhead disposed between the diffuser and the support, wherein the showerhead includes a plurality of holes configured to direct the one or more process gases from the diffuser to a region between the showerhead and the support; an exhaust coupled to the floor; and a heater disposed in the interior volume between the pedestal and the floor; and wherein the enclosure includes a door configured to facilitate transferring the susceptor into and out of the enclosure.

In some embodiments, a method of baking a plurality of susceptors in a baking chamber, includes: placing each of the plurality of susceptors onto a pedestal in an interior volume of a respective chamber of the baking chamber, wherein each respective chamber is fluidly independent; heating the plurality of susceptors via a heater disposed below the pedestal in each respective chamber to bake the plurality of susceptors; flowing one or more process gases into a top region of each respective chamber through a gas line; directing a flow of the one or more process gases via a showerhead towards each susceptor and around an outer sidewall of each susceptor; and exhausting the one or more process gases from a floor of each respective chamber.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
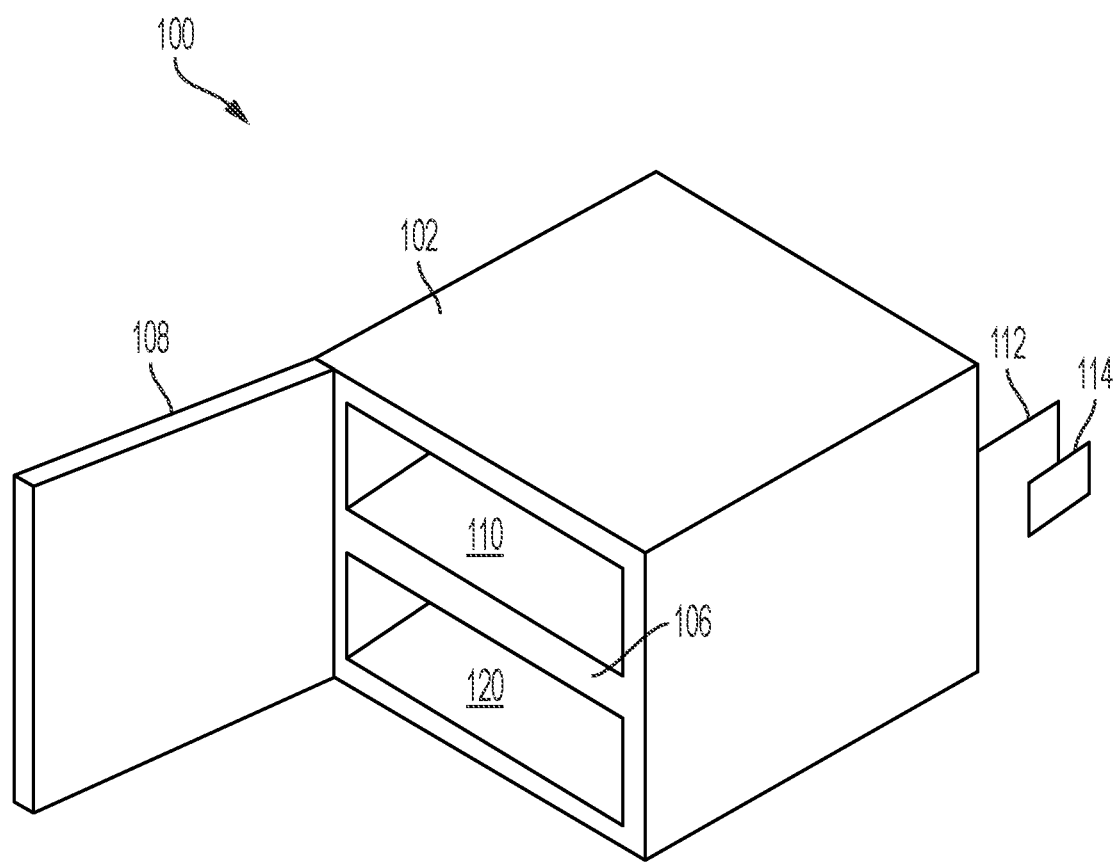
FIG. 1 is a schematic isometric view of a baking chamber in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a baking chamber for processing chamber components and methods of use thereof are provided herein. The embodiments of baking chambers described herein advantageously accommodate one or more chamber components. For example, the one or more chamber components may be a plurality of chamber components to increase processing throughput via batch baking. In some embodiments, the one or more chamber components may be susceptors configured to hold a plurality of substrates, carrier plates, process kits, or the like. For each of the one or more chamber components, the baking chamber includes a respective enclosed chamber configured to provide a gas curtain that extends from an upper portion of the respective enclosed chamber along an upper surface of the chamber component, around an outer surface of the chamber component and to a lower portion of the respective enclosed chamber, advantageously removing any unwanted particles from the chamber component, especially an upper surface of the chamber component. A heater is generally disposed in each respective enclosed chamber such that the gas curtain hits the chamber component before the heating element. Particles of the gas curtain along with any unwanted particles generated during processing (e.g., baking of the chamber component) may be exhausted via an exhaust disposed in the lower portion of each respective enclosed chamber.

The baking chamber may be made of a metal or metal alloy. The heater may also comprise a metal or metal allow. When heated, the baking chamber and the heater may release particles, causing metal contamination within the baking chamber. In some embodiments, the baking chamber and the heater may be made of a metal alloy having low levels of certain elements that are more prone to contaminate the baking chamber at high temperatures. As an illustrative example, one or more of the baking chamber and the heater can be made of materials having low levels of manganese (Mn), for example, less than two percent Mn by composition. As such, the baking chambers provided herein, with a gas curtain providing a laminar flow design and material selection, advantageously mitigate potential metal contamination on the susceptors at high temperature (e.g., >400 degree C.) and low vacuum level (e.g., <1e^-2 Torr) conditions.

FIG. 1 is a schematic isometric view of a baking chamber in accordance with at least some embodiments of the present disclosure. The baking chamber 100 includes an enclosure 102 defining one or more chambers therein. As shown in FIG. 1, the enclosure 102 defines an upper chamber 110, or first chamber, and a lower chamber 120, or second chamber, fluidly independent from the upper chamber 110. In some embodiments, the upper chamber 110 is disposed vertically above the lower chamber 120. In some embodiments, a divider plate 106 is disposed between the upper chamber 110 and the lower chamber 120. The enclosure 102 may have a rectangular, circular, oval, or other suitable cross-sectional shape. The enclosure 102 may generally be made of a metal material suitable for high temperature baking, for example, for temperatures greater than 400 degrees Celsius.

Each of the upper chamber 110 and the lower chamber 120 may accommodate a one or more chamber components therein. The enclosure 102 generally includes a door 108 configured to facilitate transferring chamber components into and out of the enclosure 102. In other embodiments, the baking chamber 100 may include multiple doors corresponding with each of the plurality of fluidly independent chambers (e.g., a first door for the upper chamber 110 and a second door for the lower chamber 120). The door 108 may be hingedly coupled to the enclosure 102. The upper chamber 110 and the lower chamber 120 include respective exhausts that are fluidly coupled to an exhaust line 112 disposed outside of the enclosure 102 to evacuate the upper chamber 110 and the lower chamber 120. The exhaust line 112 may be coupled to a vacuum system 114 comprising a pump and one or more valves configured to regulate pressure in the exhaust line 112.

Figure 2:
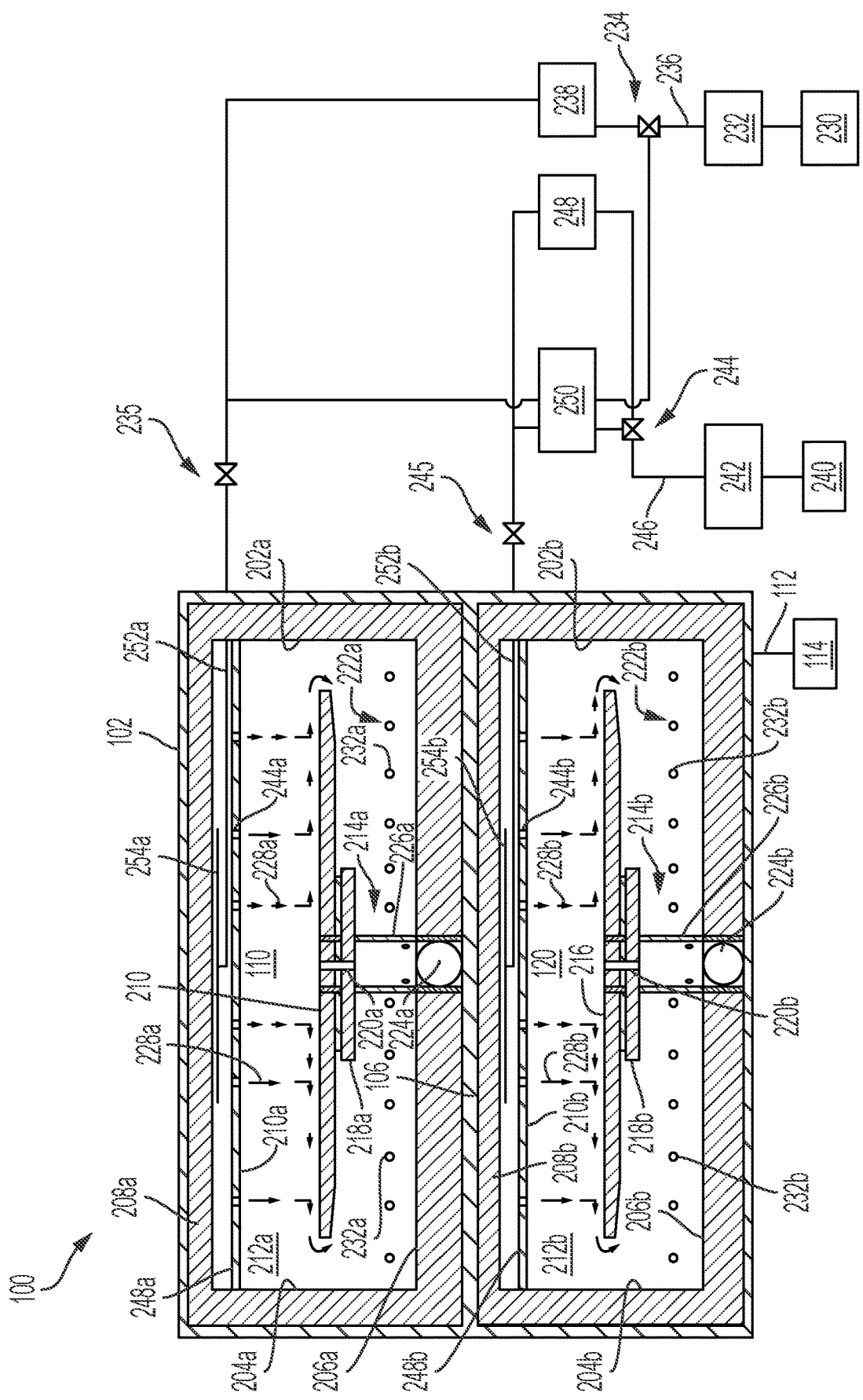
FIG. 2 is a schematic cross-sectional side view of a baking chamber in accordance with at least some embodiments of the present disclosure.

FIG. 2 is a schematic cross-sectional side view of a baking chamber 100 in accordance with at least some embodiments of the present disclosure. In some embodiments, the upper chamber 110 and the lower chamber 120 have a similar layout and similar or the same components disposed therein. The upper chamber 110, or first chamber, includes a chamber body 202a having a floor 206a and sidewalls 204a that couple the floor 206a to a lid 208a of the chamber body 202a to define an interior volume 212a. The lower chamber 120, or second chamber, includes a chamber body 202b having a floor 206b and sidewalls 204b that couple the floor 206b to a lid 208b of the chamber body 202b to define an interior volume 212b. In some embodiments, the chamber bodies 202a, 202b are integrally formed with the enclosure 102. In some embodiments, the chamber body 202a and the chamber body 202b are disposed within respective compartments formed by the enclosure 102 and divider plate 106. In some embodiments, the chamber body 202a and the chamber body 202b are made of a nickel-chromium-iron alloy, such as Inconel® commercially available from Huntington Alloys Corporation of Huntington, West Virginia.

A support 214a is disposed in the interior volume 212a for supporting a chamber component (e.g., a first susceptor 210 configured to hold one or more substrates). A support 214b is disposed in the interior volume 212b for supporting a chamber component (e.g., a second susceptor 216 configured to hold one or more substrates). Each of support 214a and the support 214b include respective shafts 226a, 226b coupled to respective pedestals 218a, 218b. The pedestal 218a includes a support surface for supporting the first susceptor 210 and a central opening 220a coupled to an exhaust 224a that is coupled to the exhaust line 112. The pedestal 218b includes a support surface for supporting the second susceptor 220 and a central opening 220b coupled to an exhaust 224b that is coupled to the exhaust line 112. In some embodiments, the pedestals 218a, 218b have an outer diameter less than an outer diameter of the first susceptor 210 and the second susceptor 216.

A heater 222a is disposed in the interior volume 212a to heat the interior volume 212a and the first susceptor during use. In some embodiments, the heater 222a is disposed between the pedestal 218a and the floor 206a. A heater 222b is disposed in the interior volume 212b to heat the interior volume 212b and the second susceptor during use. In some embodiments, the heater 222b is disposed between the pedestal 218b and the floor 206b. In some embodiments, the heaters 222a, 222b comprise a plurality of tubular heating elements 232a, 232b having a resistive heating element disposed therein. In some embodiments, the plurality of tubular heating elements 232a, 232b are disposed parallel to each other between sidewalls 204a, 204b, respectively. In some embodiments, heaters 222a, 222b are made of a same material as the chamber bodies 202a, 202b. The heaters 222a, 222b may be coupled to one or more thermocouples to facilitate temperature control.

Figure 3:
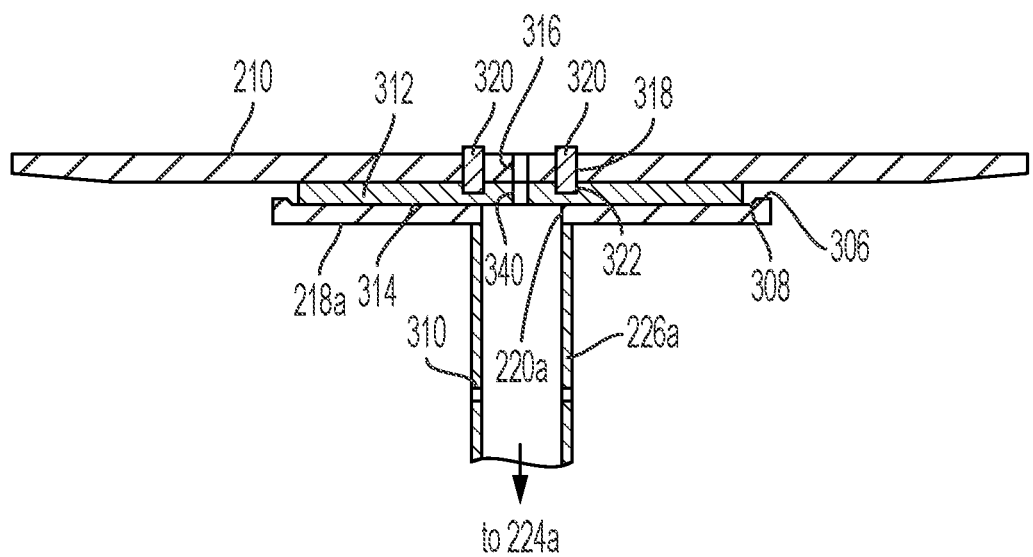
FIG. 3 is a cross-sectional side view of a support in accordance with at least some embodiments of the present disclosure.

FIG. 3 is a cross-sectional side view of a support 214a in accordance with at least some embodiments of the present disclosure. The following description of FIG. 3 with respect to the support 214a and the first susceptor 210 in the upper chamber 110 is applicable to the support 214b and the second susceptor 216 disposed in the lower chamber 120. In some embodiments, the pedestal 218a includes an outer lip 306 having an upper surface 308 that extends upward and radially outward from a support surface 314 of the pedestal 218a to align or retain the first susceptor 210. In some embodiments, the first susceptor 210 rests on or is coupled to a carrier plate 312. The carrier plate 312 may be sized to rest on the support surface 314 of the pedestal 218a within the outer lip 306.

In some embodiments, the first susceptor 210 includes a central opening 316. In some embodiments, the first susceptor 210 includes a plurality of peripheral openings 318 arranged in a circle about a center of the first susceptor 210. In some embodiments, the plurality of peripheral openings 318 are disposed about the central opening 316. In some embodiments, a plurality of pins 320 may extend through the plurality of peripheral openings 318 and at least partially into a plurality of openings 322 in the carrier plate 312 to align the first susceptor 210 with respect to the carrier plate 312. The carrier plate 312 may include a central opening 340 aligned with the central opening 316 of the first susceptor 210 to provide a gas flow path through the first susceptor 210 through the central opening 220a in the pedestal 218a and into the exhaust 224a. The gas flow path through the central opening 316 facilitates exhausting moisture and contaminants proximate a central region above the first susceptor 210 during use.

In some embodiments, the shaft 226a includes radial openings 310 fluidly coupled to the exhaust 224a. In some embodiments, the shaft includes radial openings 310 coupled to the exhaust 224a to direct flow from a lower portion of the interior volume 212a to the exhaust 224a. In some embodiments, the radial openings 310 are advantageously disposed between the heater 222a and the floor 206a so that any contaminants disposed on or proximate the heater 222a are more readily exhausted via the exhaust 224a without contaminating the first susceptor 210.

Referring back to FIG. 2, in some embodiments, a first gas source 230 provides one or more process gases to the upper chamber 110 via a first external gas line 236. A first mass flow controller (MFC) 232 may be disposed downstream of the first gas source 230 to measure and control a flow of the one or more process gases. In some embodiments, a second gas source 240 provides one or more process gases to the lower chamber 120 via a second external gas line 246. A second mass flow controller (MFC) 242 may be disposed downstream of the second gas source 240 to measure and control a flow of the one or more process gases to the lower chamber 120. In some embodiments, the first gas source 230 and the second gas source 240 are the same. In some embodiments, the one or more process gases comprise nitrogen gas, argon gas, or the like. The first external gas line 236 and the second external gas line 246 are generally disposed outside of the enclosure 102.

The first external gas line 236 may extend into a first gas heater 238 and a gas cooler 250 to selectively heat or cool the one or more process gases delivered to the upper chamber 110 to pre-heat the upper chamber 110 prior to a baking process or cool down the upper chamber 110 after a baking process. In some embodiments, a first valve 234 disposed downstream of the first gas source 230 facilitates diverting the flow of process gases to either the first gas heater 238 or the gas cooler 250. For example, the first valve 234 may be a three-way valve or two two-way valves. In some embodiments, the first external gas line 236 includes a first inlet valve 235 disposed downstream of the first gas heater 238 and the gas cooler 250 to control a flow of the one or more process gases delivered to the upper chamber 110. The upper chamber 110 includes a gas line 252a disposed in the interior volume 212a proximate the lid 208a and fluidly coupled to the first external gas line 236 to supply one or more process gases from the first external gas line 236 to the interior volume 212a.

The second external gas line 246 may extend into a second gas heater 248 and the gas cooler 250 to selectively heat or cool the one or more process gases delivered to the lower chamber 120 to pre-heat the lower chamber 120 prior to a baking process or cool down the lower chamber 120 after a baking process. In some embodiments, a second valve 244 disposed downstream of the second gas source 240 facilitates diverting the flow of process gases to either the second gas heater 248 or the gas cooler 250. For example, the second valve 244 may be a three-way valve or two two-way valves. In some embodiments, the second external gas line 246 includes a second inlet valve 245 disposed downstream of the second gas heater 248 and the gas cooler 250 to control a flow of the one or more process gases delivered to the lower chamber 120. The lower chamber 120 includes a gas line 252b disposed in the interior volume 212b proximate the lid 208b and fluidly coupled to the second external gas line 246 to supply one or more process gases from the second external gas line 246 to the interior volume 212b.

In some embodiments, the first gas heater 238 and the second gas heater 248 are separate to independently control a temperature of the first external gas line 236 and the second external gas line 246. However, in other embodiments, the first gas heater 238 and the second gas heater 248 may be the same gas heater. In some embodiments, the first external gas line 236 and the second external gas line 246 extend into a single gas cooler (e.g., gas cooler 250). In other embodiments, the first external gas line 236 and the second external gas line 246 may extend into different gas coolers to independently cool the first external gas line 236 and the second external gas line 246. In some embodiments, the first gas heater 238 and the second gas heater 248 are configured to heat the one or more process gases up to about 200 degrees Celsius. In some embodiments, the gas cooler 250 is configured to cool the one or more process gases to a temperature of about 40 to about −5 degrees Celsius.

In some embodiments, the gas line 252a in the upper chamber 110 is coupled to a diffuser 254a. The diffuser 254a is disposed in the interior volume 212a of the upper chamber 110 proximate the lid 210a and configured to supply the one or more process gases into the interior volume 212a. In some embodiments, the gas line 252b in the lower chamber 120 is coupled to a diffuser 254b. The diffuser 254b is disposed in the interior volume 212b of the lower chamber 120 proximate the lid 210b and configured to supply the one or more process gases into the interior volume 212b.

A showerhead 248a is disposed in the upper chamber 110 between the gas line 252a and the support 214a. The showerhead 248a includes a plurality of holes 244a configured to direct the one or more process gases from the gas line 252a to a region between the showerhead 248a and the support 214a. In some embodiments, a showerhead 248b is disposed in the lower chamber 120 between the gas line 252b and the support 214b. The showerhead 248b includes a plurality of holes 244b configured to direct the one or more process gases from the gas line 252b to a region between the showerhead 248b and the support 214b. In some embodiments, the showerheads 248a, 248b are coupled to the respective sidewalls 204a, 204b of the upper chamber 110 and the lower chamber 120.

In some embodiments, the exhaust 224a of the upper chamber 110 is coupled to the floor 206a and the exhaust 224*b* of the lower chamber 120 is coupled to the floor 206*b*. During use, the showerheads 248*a*, 248*b* and the exhausts 224*a*, 224*b* are configured to provide respective gas curtains 228*a*, 228*b* that flow from the showerheads 248*a*, 248*b* to the respective susceptors (e.g., the first susceptor 210 and the second susceptor 216), around the susceptors and into the exhausts 224*a*, 224*b*. The gas curtains 228*a*, 228*b* advantageously mitigate contaminants from an upper surface of the respective susceptors.

Figure 4:
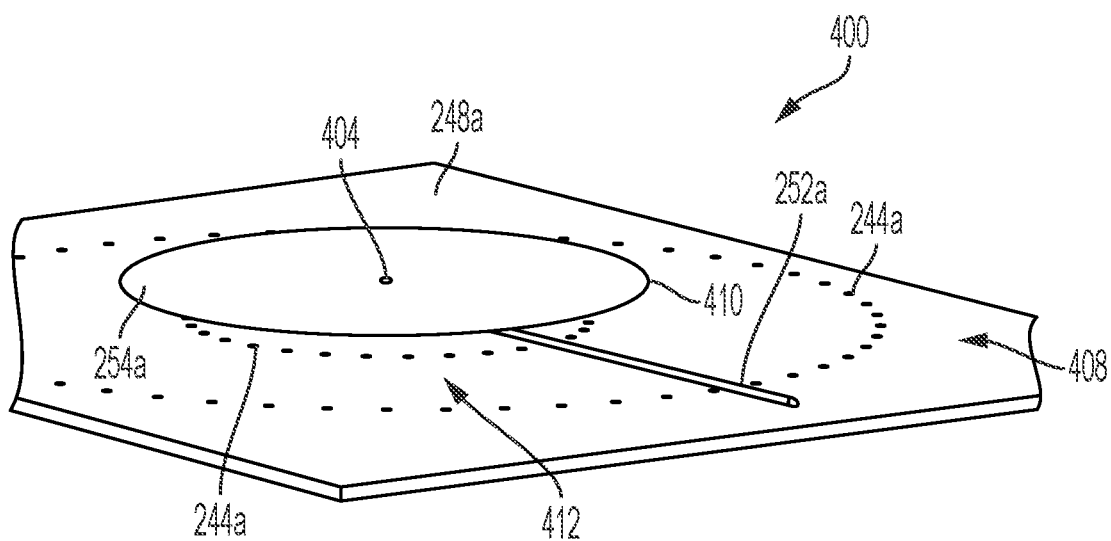
FIG. 4 is an isometric view of gas delivery components in accordance with at least some embodiments of the present disclosure.

FIG. 4 is an isometric view of gas delivery components 400 in accordance with at least some embodiments of the present disclosure. The gas delivery components 400 of the upper chamber 110 comprise the gas line 252*a*, the diffuser 254*a*, and the showerhead 248*a*. The following description of FIG. 4 with respect to the gas delivery components 400 of the upper chamber 110 is applicable to the gas delivery components 400 disposed in the lower chamber 120.

In some embodiments, the diffuser 254*a* includes one or more openings 404 on a side opposite the showerhead 248*a* and configured to spray the one or more process gases towards the lid 208*a* such that the one or more process gases flow over an outer sidewall 410 of the diffuser 254*a*. In some embodiments, the one or more openings 404 are on a side facing the showerhead 248*a* and configured to spray the one or more process gases towards the showerhead 248*a*. In some embodiments, the one or more openings 404 comprise a single opening centrally located on the diffuser 254*a*. In some embodiments, the diffuser 254*a* is a substantially flat plate with a circular shape. In some embodiments, the showerhead 248*a* has a rectangular shape. In some embodiments, the diffuser 254*a* has a diameter less than a width of the showerhead 248*a* such that the one or more process gases flow over the outer sidewall 410 of the diffuser 254*a*.

In some embodiments, the plurality of holes 244*a* in the showerhead 248*a* are uniformly distributed. In some embodiments, the plurality of holes 244*a* are arranged along concentric circles, wherein an outermost concentric circle 408 is disposed radially outward of the pedestal 218*a*. In some embodiments, an innermost concentric circle 412 is disposed radially inward of the outer sidewall 410 of the diffuser 254*a*.

Figure 5:
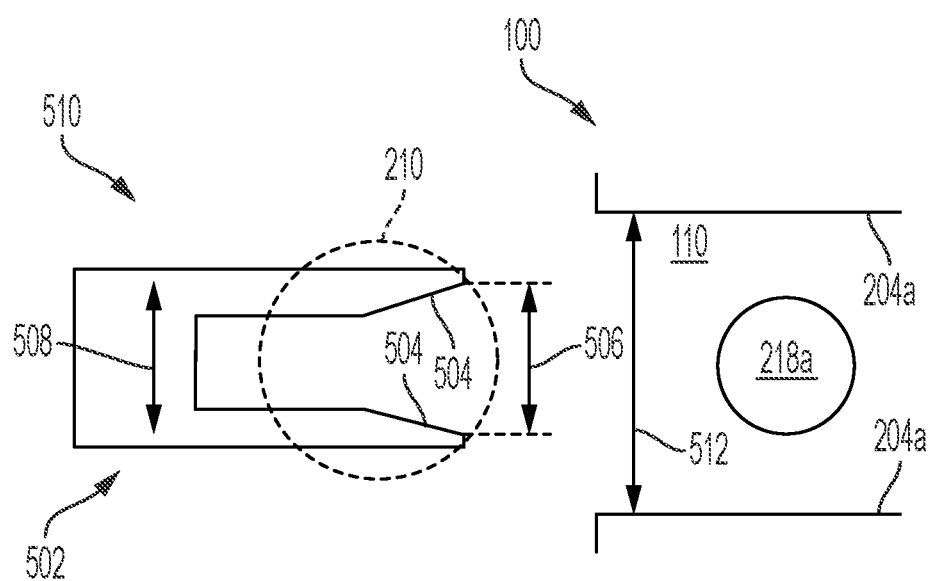
FIG. 5 is a schematic top view of a baking chamber and a susceptor transfer system in accordance with at least some embodiments of the present disclosure.

FIG. 5 is a schematic top view of a baking chamber 100 and a susceptor transfer system 510 in accordance with at least some embodiments of the present disclosure. The susceptor transfer system 510 generally comprises a trolley 502 having end effectors 504 configured to hold and transfer susceptors (e.g., the first susceptor 210) into and out of the baking chamber 100. The trolley 502 may be raised or lowered to align the end effectors 504 vertically with the respective chamber, such as the upper chamber 110 and the lower chamber 120. For example, FIG. 5 depicts the trolley 502 aligned with the upper chamber 110. The trolley 502 may roll or move laterally towards or away from the baking chamber 100

The following description with respect to the upper chamber 110 is applicable to the lower chamber 120. The end effectors 504 are spaced apart by a first distance 506. The first distance 506 is greater than an outer diameter of the pedestal 218*a* so that the pedestal 218*a* may extend between the end effectors 504 when the first susceptor 210 is placed on the pedestal 218*a*. The trolley 502 may generally have a width 508 less than a width 512 of the interior volume 212*a* of the upper chamber 110 so that the trolley may extend into the interior volume 212*a*. In some embodiments, the end effectors 504 may have an angled surface.

Figure 6:
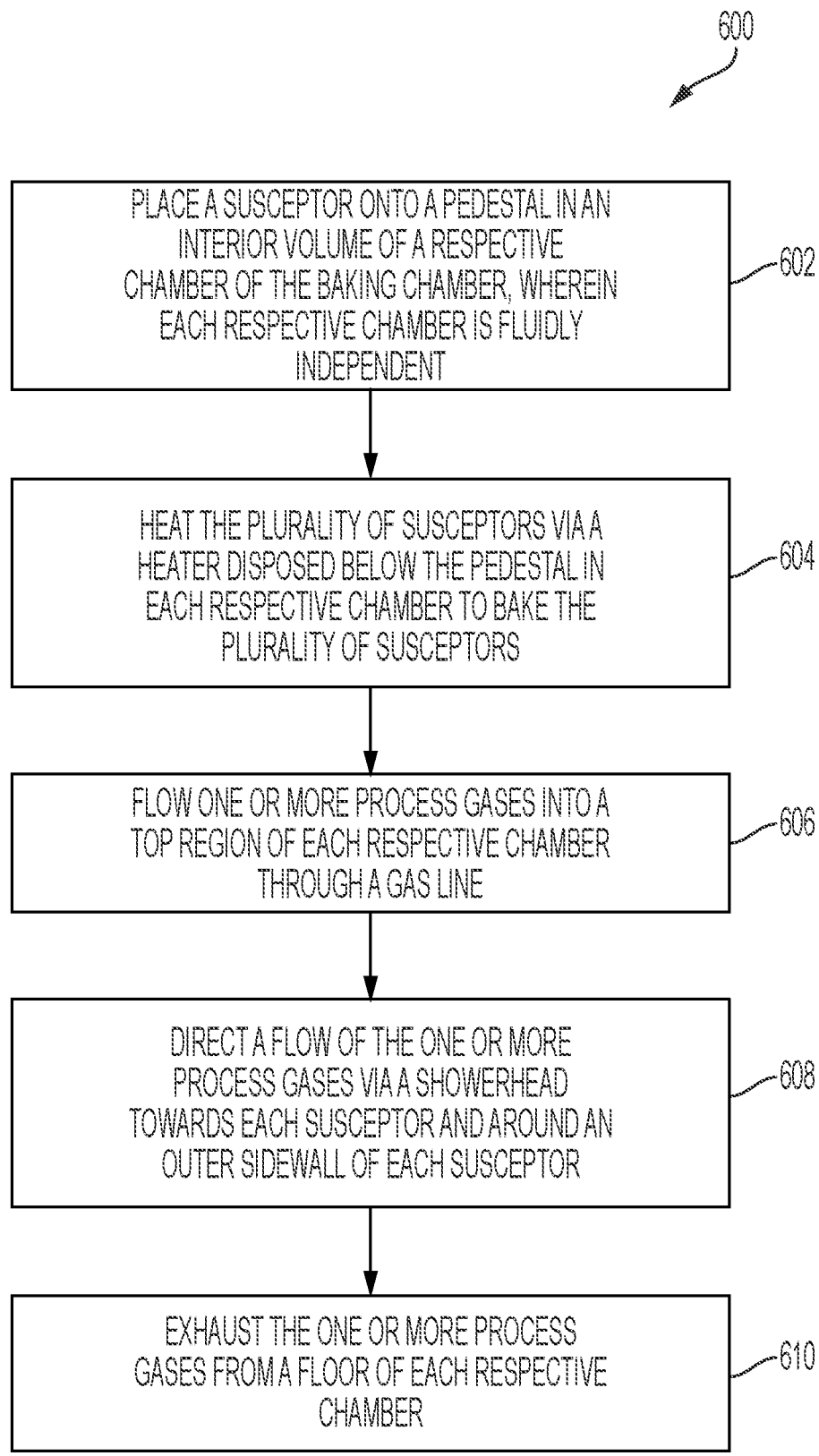
FIG. 6 is a flow chart of a method of baking a plurality of susceptors in a baking chamber in accordance with at least some embodiments of the present disclosure.

FIG. 6 is a flow chart of a method 600 of baking a plurality of susceptors in a baking chamber in accordance with at least some embodiments of the present disclosure. At 602, the method 600 includes placing each of the plurality of susceptors (e.g., the first susceptor 210 and the second susceptor 216) onto a pedestal (e.g., pedestal 218*a*, 218*b*) in an interior volume (e.g., interior volume 212*a*, 212*b*) of a respective chamber (e.g., the upper chamber 110, the lower chamber 120) of the baking chamber (e.g., baking chamber 100), wherein each respective chamber is fluidly independent. In some embodiments, each of the plurality of susceptors are placed onto the pedestal via a transfer trolley (e.g., trolley 502) having end effectors (e.g., end effectors 504) that extend into the interior volume about the pedestal. In some embodiments, placing the plurality of susceptors comprises aligning the end effectors 504 with a first chamber to place a susceptor in a first chamber, raising or lowering the end effectors 504 to align the end effectors 504 with a second chamber, and placing a subsequent susceptor into a second chamber.

After the plurality of susceptors are placed into the baking chamber, the baking chamber may be sealed, for example, by closing a door (e.g., door 108) of the baking chamber. At 604, the method 600 includes heating the plurality of susceptors via a heater (e.g., heater 222*a*, 222*b*) disposed below the pedestal in each respective chamber to bake the plurality of susceptors. In some embodiments, the plurality of susceptors are heated to a temperature of about 300 degrees to about 550 degrees Celsius.

At 606, the method 600 includes flowing one or more process gases into a top region of each respective chamber through a gas line (e.g., gas line 252*a*, 252*b*). In some embodiments, the one or more process gases comprises nitrogen gas or argon gas. In some embodiments, the one or more process gases are heated via a gas heater (e.g., first gas heater 238, second gas heater 248) and flowed into each respective chamber to preheat each respective chamber prior to heating the plurality of susceptors via the heater disposed below the pedestal in each respective chamber. In some embodiments, the one or more process gases are heated up to about 100 degrees to about 200 degrees Celsius during preheat. In some embodiments, the one or more process gases are heated to more than about 100 degrees Celsius during baking.

At 608, the method 600 includes directing a flow of the one or more process gases via a showerhead (e.g., showerhead 248*a*, 248*b*) towards each susceptor and around an outer sidewall of each susceptor. At 610, the method 600 includes exhausting the one or more process gases from an exhaust (e.g., exhaust 224*a*, 224*b*) coupled to a floor (e.g., floor 206*a*, 206*b*) of each respective chamber.

After baking, the plurality of susceptors are removed from each respective chamber in a manner similar to placing the plurality of susceptors into each respective chamber. In some embodiments, each respective chamber is cooled by flowing cool gas into the interior volume through the gas line after baking the plurality of susceptors. The cool gas advantageously reduces cool down time of the baking chamber and increases processing throughput. In some embodiments, a gas cooler (e.g., gas cooler 250) is configured to cool the one or more process gases to a temperature of about 40 to about −5 degrees Celsius to provide the cool gas into the interior volume.

While the foregoing is directed to embodiments of the present disclosure, other and further embodiments of the disclosure may be devised without departing from the basic scope thereof.

The invention claimed is:

1. A baking chamber for processing a chamber component, comprising:
an enclosure defining a first chamber, wherein the first chamber comprises:
a first chamber body having a first floor and first sidewalls that couple the first floor to a first lid of the first chamber body to define a first interior volume;
a first support disposed in the first interior volume for supporting a chamber component, the first support comprising a pedestal coupled to a shaft;
a first gas line disposed in the first interior volume proximate the first lid and configured to supply one or more process gases into the first interior volume;
a first showerhead disposed between the first gas line and the first support, wherein the first showerhead includes a plurality of holes configured to direct the one or more process gases from the first gas line to a region between the first showerhead and the first support;
a first exhaust coupled to the first floor radially inward of an outer surface of the shaft, wherein the first showerhead and the first exhaust are configured to provide a gas curtain that flows from the first showerhead to the chamber component, around the chamber component, and into the first exhaust during use; and
a first heater disposed in the first interior volume between the first support and the first floor; and
wherein the enclosure includes a door configured to facilitate transferring the chamber component into and out of the enclosure.

2. The baking chamber of claim 1, further comprising a second chamber fluidly independent from the first chamber, wherein the second chamber comprises:
a second chamber body having a second floor and second sidewalls that couple the second floor to a second lid of the second chamber body to define a second interior volume;
a second support disposed in the second interior volume for supporting a second chamber component;
a second gas line disposed in the second interior volume proximate the second lid and configured to supply one or more process gases into the second interior volume;
a second showerhead disposed between the second gas line and the second support, wherein the second showerhead includes a plurality of holes configured to direct the one or more process gases from the second gas line to a region between the second showerhead and the second support;
a second exhaust coupled to the second floor below the second support, wherein the second showerhead and the second exhaust are configured to provide a gas curtain that flows from the second showerhead to the second chamber component, around the second chamber component, and into the second exhaust during use; and
a second heater disposed in the second interior volume between the second support and the second floor.

3. The baking chamber of claim 2, wherein the first gas line in the first chamber is fluidly coupled to a first external gas line disposed outside of the enclosure, wherein the first external gas line extends through a gas cooler and a first gas heater to selectively cool or heat the one or more process gases provided to the first chamber; and wherein the second gas line in the second chamber is fluidly coupled to a second external gas line disposed outside of the enclosure, wherein the second external gas line extends through the gas cooler and a second gas heater to selectively cool or heat the one or more process gases provided to the second chamber.

4. The baking chamber of claim 2, wherein the first chamber is disposed vertically above the second chamber, and further comprising a divider plate disposed between the first chamber and the second chamber.

5. The baking chamber of claim 1, wherein the chamber component is a susceptor configured to hold one or more substrates.

6. The baking chamber of claim 1, wherein the first gas line is coupled to a first diffuser disposed between the first showerhead and the first lid, wherein the first diffuser includes one or more openings on a side of the first diffuser facing the first lid and configured to spray process gas towards the first lid and away from the first showerhead.

7. The baking chamber of claim 1, wherein the pedestal includes a central opening coupled to the first exhaust, and wherein the shaft includes radial openings fluidly coupled to the first exhaust.

8. The baking chamber of claim 7, wherein the radial openings are disposed below the first heater.

9. The baking chamber of claim 1, wherein the first chamber body is made of a nickel-chromium-iron alloy.

10. A baking chamber for processing a susceptor, comprising:
an enclosure defining an upper chamber and a lower chamber, wherein the upper chamber and the lower chamber are fluidly independent and each comprise:
a chamber body having a floor and sidewalls that couple the floor to a lid of the chamber body to define an interior volume;
a support disposed in the interior volume having a shaft coupled to a pedestal for supporting a susceptor configured to hold one or more substrates, wherein the pedestal extends radially outward beyond the shaft;
a diffuser disposed in the interior volume proximate the lid and configured to supply one or more process gases into the interior volume via a gas line;
a showerhead disposed between the diffuser and the support, wherein the showerhead includes a plurality of holes configured to direct the one or more process gases from the diffuser to a region between the showerhead and the support;
an exhaust coupled to the floor; and
a heater disposed in the interior volume between the pedestal and the floor; and
wherein the enclosure includes a door configured to facilitate transferring the susceptor into and out of the enclosure.

11. The baking chamber of claim 10, wherein the pedestal includes an outer lip that extends upward and radially outward, and further comprising a carrier plate disposed on the pedestal within the outer lip.

12. The baking chamber of claim 10, wherein the exhaust is disposed radially inward of an outer sidewall of the pedestal.

13. The baking chamber of claim 10, wherein the gas line is fluidly coupled to a gas heater and a gas cooler to selectively heat or cool one or more process gases disposed in the gas line.

14. The baking chamber of claim 10, wherein the showerhead has a rectangular shape and is coupled to sidewalls of the chamber body.

15. The baking chamber of claim 10, wherein the plurality of holes in the showerhead are arranged along concentric circles, wherein an outermost concentric circle is disposed radially outward of the pedestal.

* * * * *